United States Patent
Mo et al.

(10) Patent No.: US 10,541,707 B2
(45) Date of Patent: Jan. 21, 2020

(54) APPARATUS FOR REDUCING WANDERING SPURS IN A FRACTIONAL-N FREQUENCY SYNTHESIZER

(71) Applicant: UNIVERSITY COLLEGE CORK—NATIONAL UNIVERSITY OF IRELAND, CORK, Cork (IE)

(72) Inventors: Hongjia Mo, Cork (IE); Michael Peter Kennedy, Cork (IE)

(73) Assignee: UNIVERSITY COLLEGE CORK, NUI, CORK, Dublin (IE)

(*) Notice: Subject to any disclaimer, the term of this patent is extended or adjusted under 35 U.S.C. 154(b) by 0 days.

(21) Appl. No.: 16/041,648

(22) Filed: Jul. 20, 2018

(65) Prior Publication Data
US 2019/0089368 A1  Mar. 21, 2019

Related U.S. Application Data
(60) Provisional application No. 62/536,370, filed on Jul. 24, 2017.

(51) Int. Cl.
 *H03M 3/00* (2006.01)
(52) U.S. Cl.
 CPC ........... *H03M 3/414* (2013.01); *H03M 3/324* (2013.01); *H03M 3/394* (2013.01); *H03M 3/434* (2013.01)
(58) Field of Classification Search
 CPC ...... H03M 3/414; H03M 3/434; H03M 3/394; H03M 3/324
 USPC .......................................... 341/143; 375/350
 See application file for complete search history.

(56) References Cited

U.S. PATENT DOCUMENTS

| | | | | |
|---|---|---|---|---|
| 5,227,795 A * | 7/1993 | Yamakido | ............. | H03M 3/434 341/143 |
| 6,873,281 B1 * | 3/2005 | Esterberg | ............. | H03M 3/344 341/143 |
| 9,838,031 B2 * | 12/2017 | Dong | ................... | H03M 3/322 |
| 9,859,916 B1 * | 1/2018 | Verdant | ................. | H03M 3/418 |
| 2004/0101080 A1 * | 5/2004 | Lee | ........................ | H03L 7/1976 375/375 |
| 2005/0186920 A1 * | 8/2005 | Staszewski | ............... | H03L 7/16 455/114.1 |
| 2006/0170576 A1 * | 8/2006 | Weibiao | ................. | H03M 3/334 341/143 |
| 2008/0136532 A1 * | 6/2008 | Hufford | .................. | H03L 7/081 331/10 |
| 2014/0368368 A1 * | 12/2014 | Koli | ....................... | H03M 3/462 341/143 |
| 2015/0055737 A1 * | 2/2015 | Bourdi | .................. | H03M 3/436 375/350 |

\* cited by examiner

*Primary Examiner* — Lam T Mai
(74) *Attorney, Agent, or Firm* — Loza & Loza, LLP; Anthony G. Smyth

(57) ABSTRACT

The present invention provides a fractional-N frequency synthesizer comprising a divider controller comprising a multistage noise Shaping (MASH) digital delta-sigma modulator comprising L stages, wherein the Lth stage is configured to receive as an input a high amplitude dither signal.

12 Claims, 7 Drawing Sheets
(4 of 7 Drawing Sheet(s) Filed in Color)

APPARATUS FOR REDUCING WANDERING SPURS IN A FRACTIONAL-N FREQUENCY SYNTHESIZER

CROSS-REFERENCE TO RELATED APPLICATIONS

This application claims the benefit of U.S. Provisional Application Ser. No. 62/536,370 filed in the U.S. Patent Office on Jul. 24, 2017, the entire content of this application being incorporated herein by reference and for all applicable purposes.

FIELD OF THE DISCLOSURE

This disclosure relates to fractional-N frequency synthesizers. More particularly, this disclosure relates to mitigating wandering spurs in such synthesizers.

DESCRIPTION OF RELATED ART

Fractional-N frequency synthesizers have been widely used to generate programmable carrier frequencies for several decades. FIG. 1 shows a block diagram of one conventional fractional-N frequency synthesizer. A phase frequency detector (PFD) receives a reference frequency $f_{PD}$. The output signal from the phase frequency detector is passed through a charge pump (CP) and onto a loop filter. The output of the loop filter is then fed to a voltage controlled oscillator (VCO). The output frequency of the voltage controlled oscillator, $f_{vco}$, is fed to a multi modulus divider, which counts an integer number of cycles of the output frequency and generates the divided frequency $f_{div}$ as an input to the phase frequency detector, thus forming the synthesizer's phase-locked loop. A divider controller provides as an output the control signal y[n], to which a constant $N_0$ is added. This sum is applied to the input of the multi modulus divider to control the instantaneous divide ratio. The output frequency $f_{vco}$ is related to the reference frequency $f_{PD}$ by an integer $N_0$ plus a rational fraction (x/M), where M is called the modulus and x is the input signal to the divider controller.

One divider controller commonly used in a frequency synthesizer is a Digital Delta-Sigma Modulator (DDSM). FIG. 2 shows a block diagram of a DDSM comprising a MultistAge noise SHaping (MASH) digital delta-sigma modulator. This MASH digital delta-sigma modulator comprises a cascade of error feedback modulator sections (EFM). The first output $y_i$ of each error feedback modulator section is combined in an error cancellation network. In the case of all but the last section, the second output $e_i$ is passed to the next error feedback modulator section in the cascade.

The frequency spectrum of the output of a fractional-N frequency synthesizer is characterized by phase noise and spurious tones (spurs). In addition to the so-called reference spur, which is due to the periodic update of the synthesizer at the reference frequency $f_{PD}$, the frequency spectrum contains so-called fractional spurs. These fractional spurs have their origins in the divider controller signal y which is injected into the phase-locked loop. One known technique for breaking the periodicity of the output of the divider controller is to introduce an additive random or pseudorandom dither signal d at the input of the DDSM. The dither signal can be spectrally masked at the output of the DDSM by shaping it using a filter having a transfer function V(z), as is illustrated in FIG. 2.

A typical third-order MASH 1-1-1 digital delta sigma modulator with first-order shaped dither is illustrated in FIG. 3. The cascade comprises three first-order error feedback modulators (denoted EFM1) and an error cancellation network. A pseudorandom binary dither signal $d_1$ is input to the second EFM stage. In the z domain, $$Y(z)=(1/M)*[X(z)+(1-z^{-1})D_1(z)]+(1-z^{-1})^3 E_{q3}(z),$$

where Y, X, $D_1$ and $E_{q3}$ are the z transforms of y, x, the dither signal $d_1$, and the quantization error of the third EFM stage in FIG. 3.

In the past, synthesizers operated at lower resolution (that is at smaller values of modulus M). At such a resolution, the synthesizer operated without any significant issues. However, one problem has become apparent as higher resolution fractional-N frequency synthesizers have become more frequently used, such as for example 20 bit. This relates to the phenomenon commonly known as "wandering spurs". This phenomenon concerns the fact that at certain carrier frequencies, equivalently for certain values of the input x, one or more spurs move back and forth in the frequency spectrum, wandering to and from the carrier at a relatively low frequency.

FIGS. 4A and 4B show typical manifestations of such wandering spurs in the frequency domain. FIG. 4A shows the VCO spectrogram and FIG. 4B shows the output phase noise spectrogram in respect of a frequency synthesizer with a DDSM comprising a first order LSB dithered third-order Multi stAge noise SHaping (MASH) 1-1-1, such as that in FIG. 3, with $M=2^{20}$ and $x=1$. In this example, the parameter values of the synthesizer are $f_{PD}=20$ MHz, closed Loop Bandwidth=150 kHz, gain=$229.14\times10^6$, $f_{p1}=663$ kHz, $f_{p2}=330$ kHz, $f_z=18.75$ kHz, $f_0=886.6$ kHz and $K_{VCO}=10$ MHz/V. The reset delay of the phase frequency detector (PFD) is 0.5 ns. The charge pump has a nominal current $I_{CPnom}=1.5$ mA and a relative mismatch between the up and down currents of $\varepsilon=8\%$. $N_{int}=45$, giving an output frequency of $f_{VCO}=(N_{int}+x/M) f_{PD}=900,000,019.074$ Hz. It can be seen from FIG. 4A that a spur periodically moves in towards the carrier and back out again. The period of the wandering spur $T_{wp}=M/x*T_{pd}$, where $T_{pd}$ (=$1/f_{PD}$) is the period of the phase frequency detector ($T_{wp}=52.4288$ ms in this example). This means that a large ratio M/x of the Modulus M and the input x leads to a large period of the wandering spur.

FIG. 5 shows a spectrogram (with logarithmic frequency axis) of the output of a fractional-N frequency synthesizer having a linear charge pump and in which the first-order dithered MASH 1-1-1 of FIG. 3 is used as the divider controller. In this example, $M=2^{20}$ and $x=524288$. It can be seen from this figure that the spectrogram exhibits periodic branching structures to the right of the figure which are characteristic of wandering spurs.

FIG. 6 shows a spectrogram of the output of a fractional-N frequency synthesizer in which the first-order dithered MASH 1-1-1 of FIG. 3 is also used as the divider controller. The only difference between FIGS. 5 and 6 is that the charge pump in the synthesizer which produced FIG. 5 has equal up and down currents while the charge pump which produced FIG. 6 has an 8% static mismatch between the up and down currents. In any event, the spectrogram of FIG. 6 again clearly features characteristic wandering spurs.

It will therefore be appreciated that a wandering spur degrades the performance of the overall system in which the synthesizer is being used. This has been found to have a particular detrimental effect when the system is being used in applications such as communications, radar, and instrumentation.

SUMMARY OF THE EMBODIMENTS

Various embodiments of a fractional-N frequency synthesizer are disclosed. Broadly speaking, a fractional-N frequency synthesizer is disclosed, comprising a divider controller comprising a multistage noise Shaping (MASH) digital delta-sigma modulator comprising L stages, wherein the Lth stage is configured to receive as an input the sum of the output of the preceding stage and a high amplitude dither signal.

In one embodiment, the MASH digital delta-sigma modulator comprises a MASH digital delta-sigma modulator with additive first-order dither. In one embodiment, the high amplitude dither signal comprises an integer dither signal which is uniformly distributed in the range [0, 1, . . . , M−1], wherein M corresponds to the modulus of the MASH digital delta-sigma modulator.

In another embodiment, the high amplitude dither signal comprises a dither signal which is uniformly distributed in the range [0, 1, . . . , $2^K-1$]*M/$2^K$, wherein M=$2^B$, and further wherein M corresponds to the modulus of the MASH digital delta-sigma modulator, B corresponds to the number of bits, and K comprises an integer between 1 and 6.

In one embodiment, the MASH digital delta-sigma modulator comprises a MASH 1-1-1 architecture.

In one embodiment, the MASH 1-1-1 architecture with additive first-order dither comprises a first stage, a second stage and a third stage, and wherein the third stage of the MASH architecture is configured to receive as an input the sum of the output of the preceding stage and the high amplitude dither signal.

In one embodiment, the high amplitude dither signal is filtered in accordance with the equation:

$$Y(z)=(1/M)*[X(z)+(1-z^{-1})D_1(z)+(1-z^{-1})^2 D_2(z)]+(1-z^{-1})^3 E_{q3}(z),$$

where Y corresponds to the z transform of the output signal of the MASH 1-1-1 architecture; X corresponds to the z transform of the input signal to the MASH 1-1-1 architecture; $D_1$ corresponds to the z transform of the additive first order dither signal; $D_2$ corresponds to the z transform of the high amplitude dither signal; and $E_{q3}$ corresponds to the z transform of the quantization error of the third stage of the MASH 1-1-1 architecture.

In one embodiment, the second stage of the MASH architecture is configured to receive as an input a binary dither signal.

In one embodiment, each of the L stages comprises a first order error feedback modulator (EFM).

BRIEF DESCRIPTION OF THE DRAWINGS

The patent or application file contains at least one drawing executed in color. Copies of this patent or patent application publication with color drawing(s) will be provided by the Office upon request and payment of the necessary fee. The present disclosure will be more clearly understood from the following description of an embodiment thereof, given by way of example only, with reference to the accompanying drawings, in which:—

FIG. 4A is a VCO spectrogram and FIG. 4B is an output phase noise spectrogram (with logarithmic frequency axis) for a fractional-N frequency synthesizer with a MASH 1-1-1 divider controller architecture;

DETAILED DESCRIPTION

The present disclosure provides a fractional-N frequency synthesizer which reduces the effect of wandering spurs exhibited by the synthesizer when operating with a higher resolution DDSM-based divider controller. The present disclosure will now be described in conjunction with FIG. 7 onwards.

The inventors of the present disclosure determined that it is the interaction between the signal injected by a DDSM-based divider controller and a synthesizer's phase-locked loop which causes wandering spurs.

In accordance with the present disclosure, the magnitudes of the wandering spurs introduced by a DDSM into a fractional-N frequency synthesizer are reduced by adding a high amplitude random dither signal at the input to the last stage of the DDSM.

Figure 7:
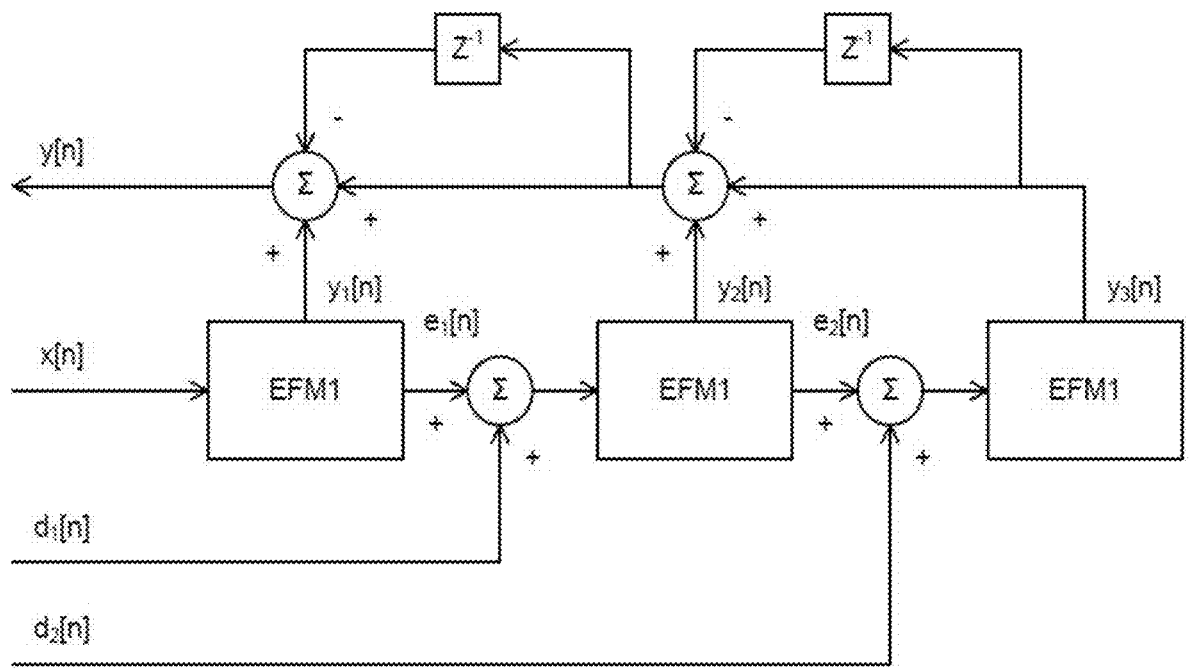
FIG. 7 shows a block diagram of an embodiment of a high amplitude dithered MASH 1-1-1 divider controller in accordance with the present disclosure.

FIG. 7 shows one embodiment of the present disclosure where the DDSM incorporated into the synthesizer comprises a modified MASH 1-1-1 divider controller. The MASH 1-1-1 divider controller comprises a cascade of three first-order Error Feedback Modulators (EFM). The MASH 1-1-1 is known to suffer from limit cycles. Therefore a binary dither signal, denoted $d_1$, is added to the input of the second stage to prevent limit cycle behavior.

Figure 3:
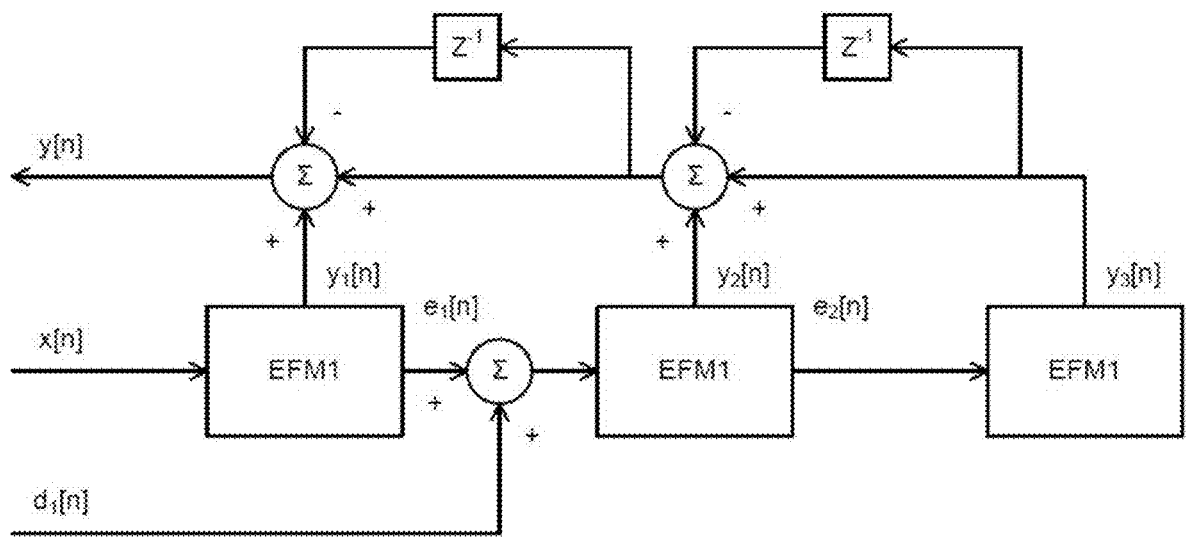
FIG. 3 shows a block diagram of a conventional additive LSB-dithered MASH 1-1-1 divider controller with first-order shaped additive dither.
Figure 4A:
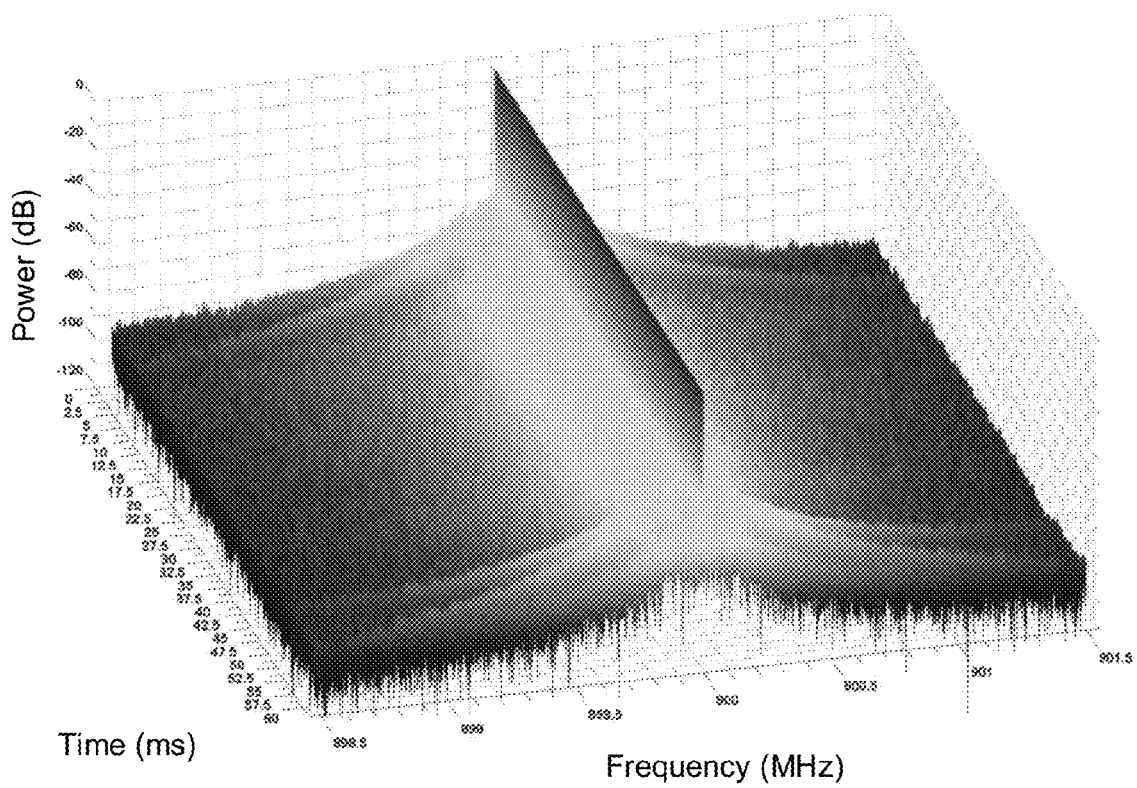
FIGS. 4A and 4B shows typical manifestations of wandering spurs in the frequency domain, where
Figure 4B:
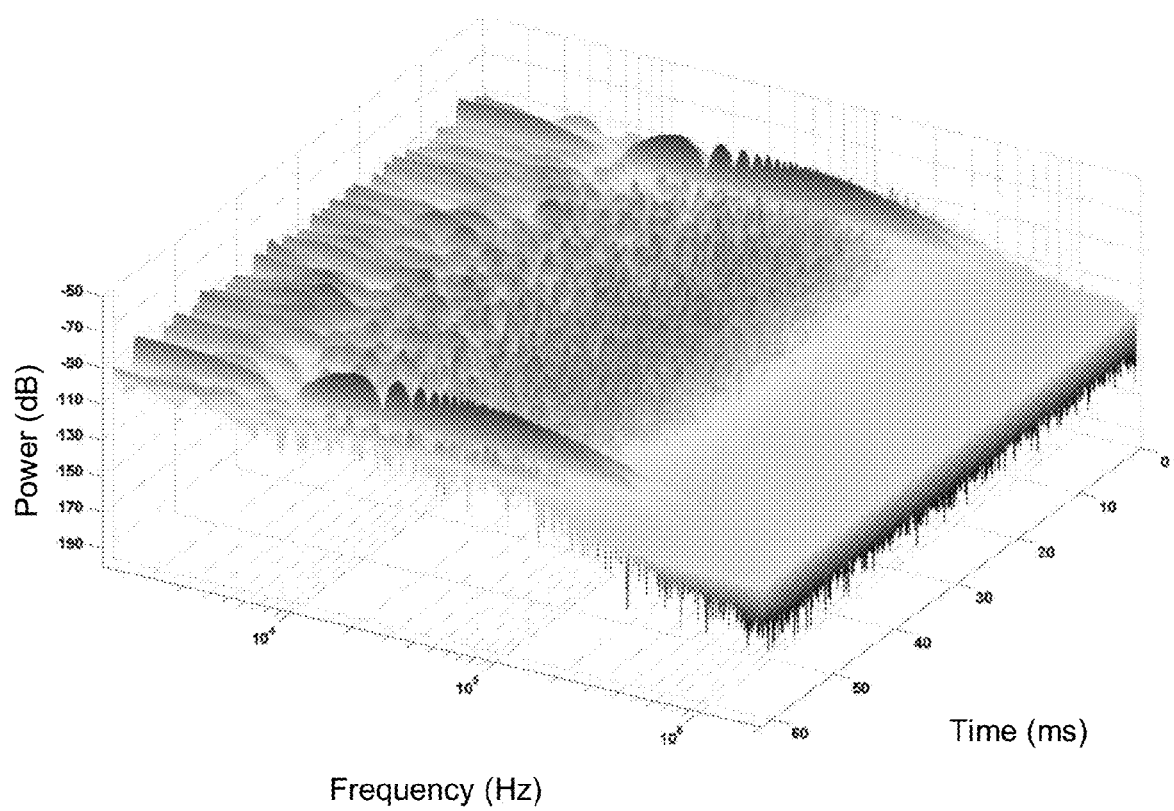

The MASH 1-1-1 divider controller is further modified by adding a high-amplitude dither to the last stage of the MASH architecture. This involves adding a full range uniform dither signal to the third stage of the DDSM. This dither signal is second-order high passed filtered when it appears at the output. In the z domain, $$Y(z)=(1/M)*[X(z)+(1-z^{-1})D_1(z)+(1-z^{-1})^2 D_2(z)]+(1-z^{-1})^3 E_{q3}(z),$$

where Y, X, $D_1$, $D_2$ and $E_{q3}$ are the z transforms of y, x, the dither signals $d_1$ and $d_2$, and the quantization error of the third EFM stage in FIG. 3.

In one embodiment, the dither signal $d_1$ is uniformly distributed in [0, 1] and the high amplitude dither signal $d_2$ is uniformly distributed in the range [0, 1, . . . , M−1].

In another embodiment, the high amplitude dither signal is uniformly distributed in the range [0, 1, . . . , $2^K$−1]*M/$2^K$, where M=$2^B$, B is the number of bits and K is an integer between 1 and 6.

Figure 1:
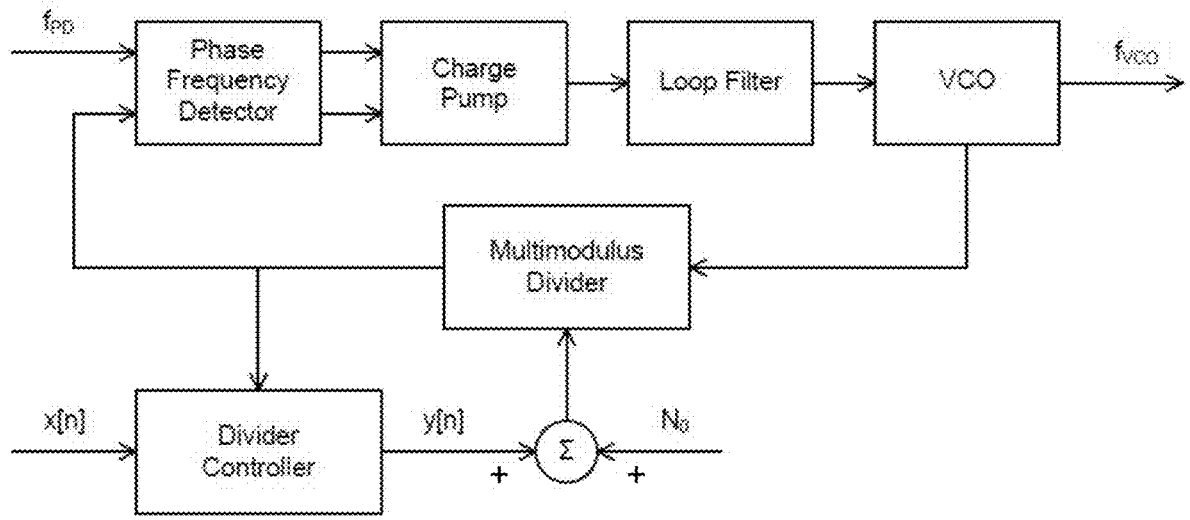
FIG. 1 shows a block diagram of a conventional fractional-N frequency synthesizer.
Figure 2:
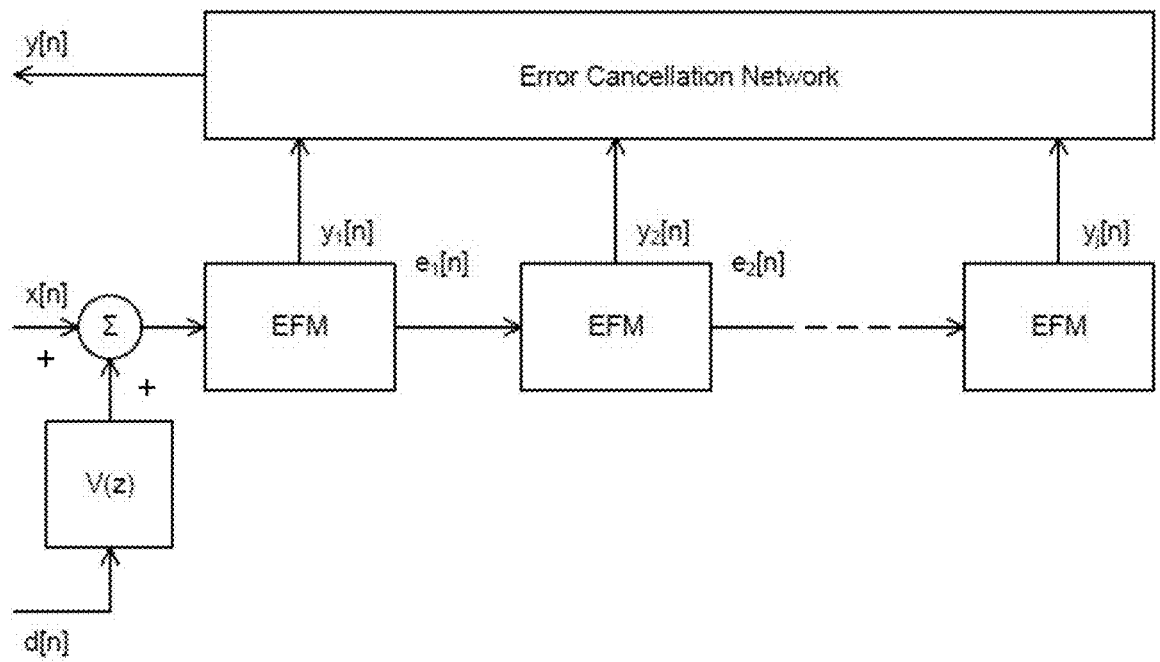
FIG. 2 shows a block diagram of a conventional divider controller based on a Multi stAge noise SHaping (MASH) digital delta-sigma modulator with shaped additive dither.
Figure 8:
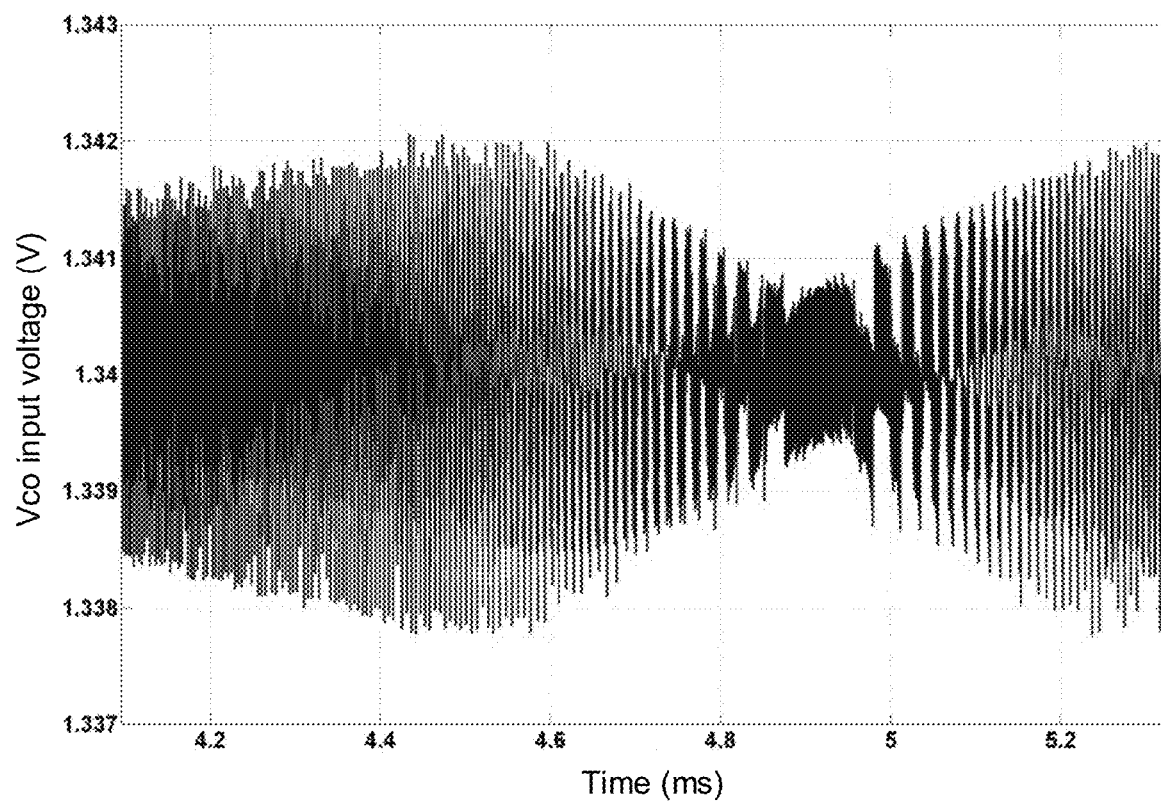
FIG. 8 shows the simulated VCO input signal in the fractional-N frequency synthesizer of FIG. 1 incorporating the conventional MASH 1-1-1 divider controller of FIG. 3.
Figure 9:
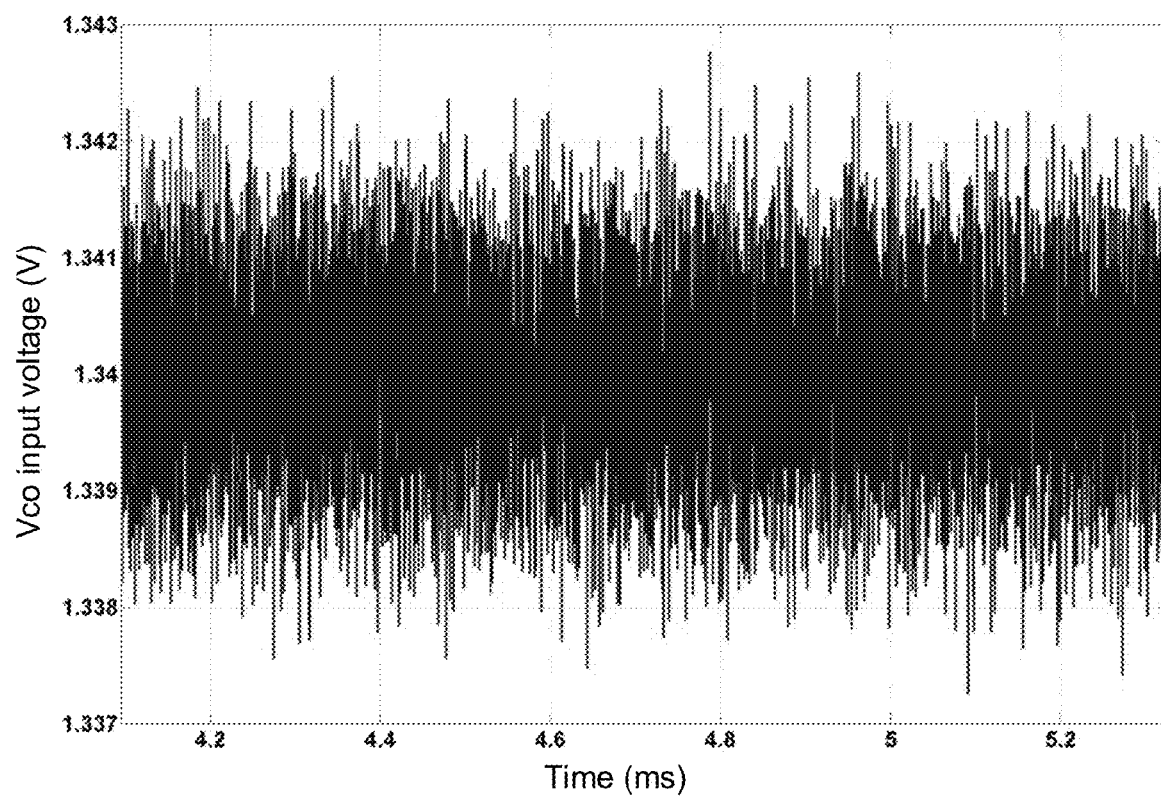
FIG. 9 shows the simulated VCO input signal in a fractional-N frequency synthesizer of FIG. 1 incorporating the high amplitude dithered MASH 1-1-1 divider controller of FIG. 7.

The wandering spur phenomenon is caused by a chirp signal which is produced at the input to the VCO. This chirp has its origin in the DDSM. By adding high amplitude dither to the last stage of the MASH divider controller, it swamps the chirp signal and eliminates the wandering spur. This can be seen by comparing FIG. 8, which shows the VCO signal in a fractional-N frequency synthesizer of FIG. 1 incorporating the conventional MASH 1-1-1 divider controller shown in FIG. 3, with the VCO signal produced in the frequency synthesizer of FIG. 1 which incorporates the high amplitude dithered MASH 1-1-1 divider controller of FIG. 7, as shown in FIG. 9. The chirp signal is evident in FIG. 8 but FIG. 9 is more noiselike.

Figure 5:
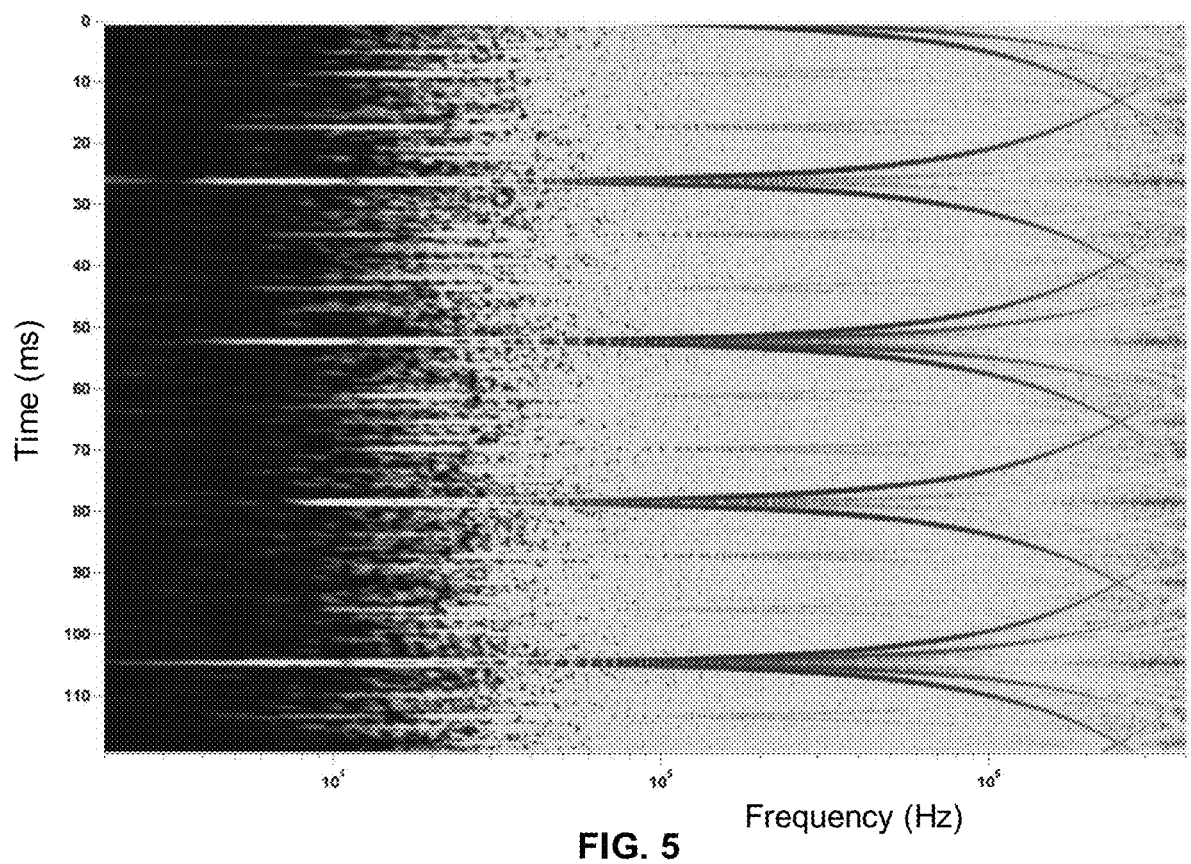
FIG. 5 shows a spectrogram of the output of the fractional-N synthesizer of FIG. 1 with the conventional dithered MASH 1-1-1 divider controller of FIG. 3 and a linear charge pump.
Figure 10:
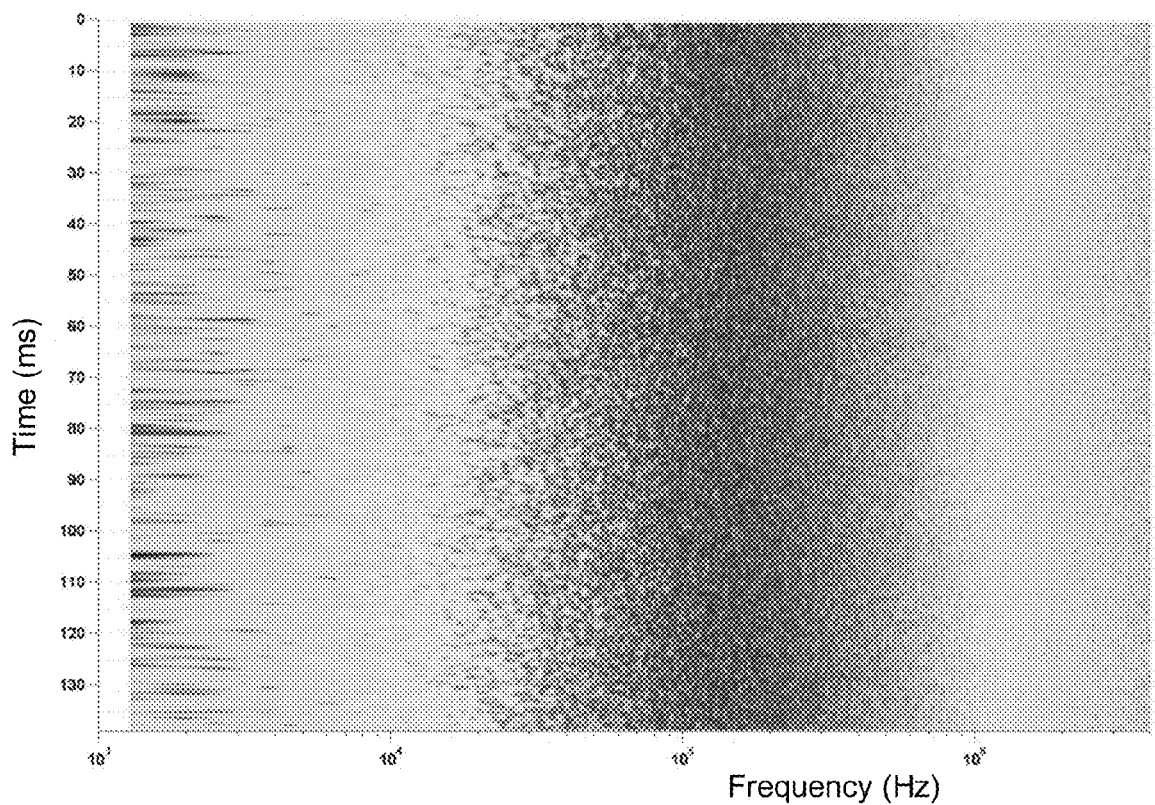
FIG. 10 shows a spectrogram of the output of a synthesizer comprising the high amplitude dithered divider controller of FIG. 7 and a linear loop.

FIG. 10 shows a spectrogram of the output of a fractional-N frequency synthesizer with an ideal linear loop in which the divider controller comprises the high amplitude dithered MASH 1-1-1 of FIG. 7 (with x=524288, M=$2^{20}$). By comparison with FIG. 5, it can be seen that this results in the elimination of wandering spurs from the output of the frequency synthesizer.

Figure 6:
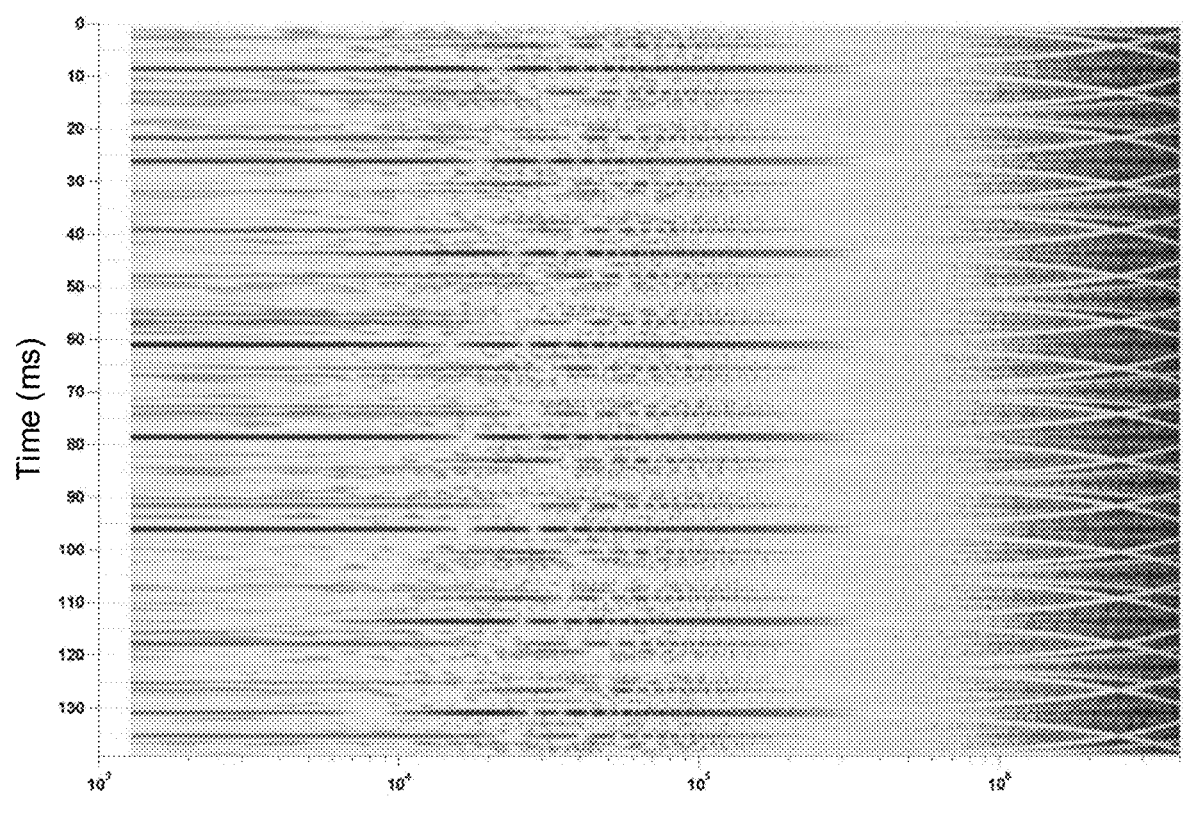
FIG. 6 shows a spectrogram of the output of a fractional-N synthesizer of FIG. 1 with the conventional dithered MASH 1-1-1 divider controller of FIG. 3 and a mismatched charge pump.
Figure 11:
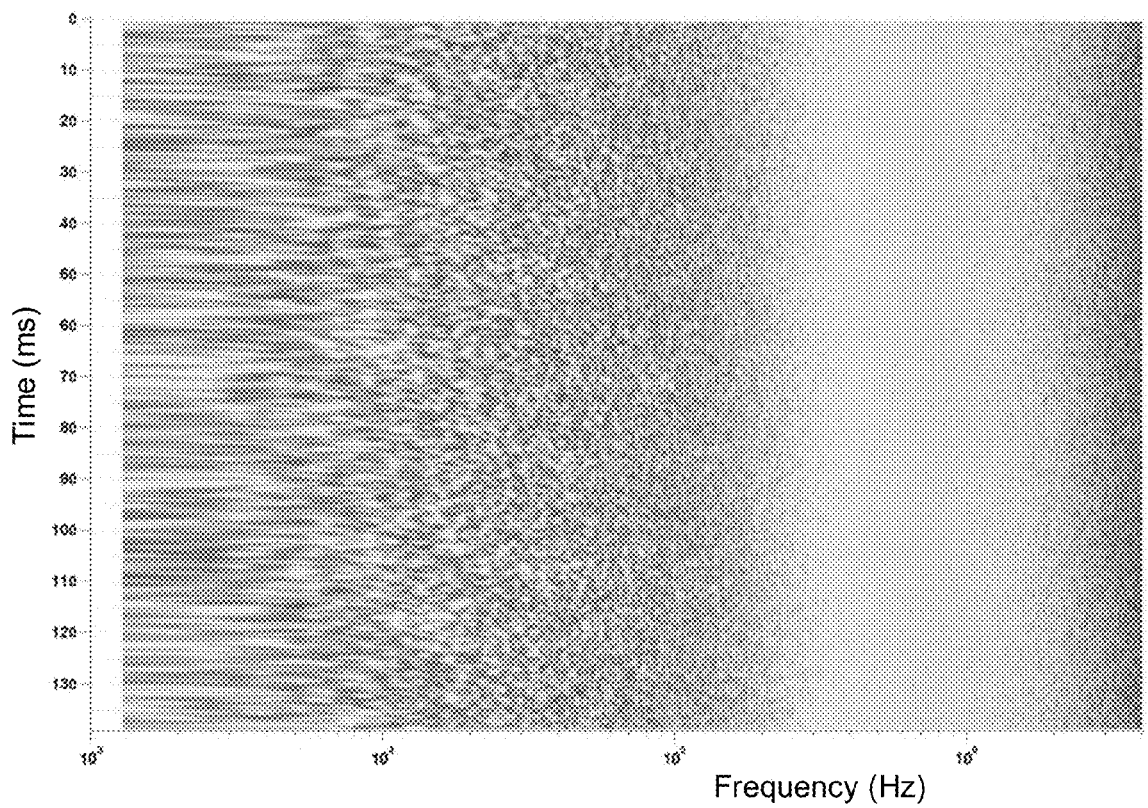
FIG. 11 shows a spectrogram of the output of a synthesizer comprising the high amplitude dithered divider controller of FIG. 7 and a nonlinear loop.

FIG. 11 shows a spectrogram of the output of a fractional-N frequency synthesizer in which the divider controller comprises the high amplitude dithered MASH 1-1-1 of FIG. 7 (with x=524288, M=$2^{20}$) with an 8% static charge pump current mismatch. As was the case with FIG. 10, no wandering spur is present in the spectrogram, by contrast with FIG. 6.

It can be seen that due to the incorporation of the modified MASH 1-1-1 divider controller into the frequency synthesizer, these spectrograms do not exhibit any wandering spurs. Thus, it will be appreciated that the fractional-N frequency synthesizer of the present disclosure provides a divider controller signal which is less prone to produce wandering spurs than a frequency synthesizer which uses a conventional dithered digital delta-sigma modulator. Through the mitigation of wandering spurs, it enables the frequency synthesizer to generate cleaner carriers for a range of applications including communications, radar and instrumentation.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The present disclosure is not limited to the embodiments hereinbefore described but may be varied in both construction and detail.

The invention claimed is:

1. A fractional-N frequency synthesizer comprising a divider controller comprising a multistage noise shaping (MASH) digital delta-sigma modulator comprising L stages, wherein the Lth stage is configured to receive as an input the sum of the output of the preceding stage and a high amplitude dither signal,
wherein the high amplitude dither signal comprises an integer dither signal which is uniformly distributed in the range [0, 1, . . . , M−1], wherein M corresponds to the modulus of the MASH digital delta-sigma modulator.

2. The fractional-N frequency synthesizer of claim 1, wherein the MASH digital delta-sigma modulator comprises a MASH digital delta-sigma modulator with additive first-order dither.

3. The fractional-N frequency synthesizer of claim 2, wherein the MASH digital delta-sigma modulator comprises a MASH 1-1-1 architecture.

4. The fractional-N frequency synthesizer of claim 1, wherein each of the L stages comprises a first order error feedback modulator (EFM).

5. A fractional-N frequency synthesizer comprising a divider controller comprising a multistage noise shaping (MASH) digital delta-sigma modulator comprising L stages, wherein the Lth stage is configured to receive as an input the sum of the output of a preceding stage and a high amplitude dither signal,
wherein the high amplitude dither signal comprises a dither signal which is uniformly distributed in the range [0, 1, . . . , $2^K$−1]*M/$2^K$, wherein M=$2^B$, and wherein M corresponds to the modulus of the MASH digital delta-sigma modulator, B corresponds to the number of bits, and K comprises an integer between 1 and 6.

6. The fractional-N frequency synthesizer of claim 5, wherein the MASH digital delta-sigma modulator comprises a MASH digital delta-sigma modulator with additive first-order dither.

7. The fractional-N frequency synthesizer of claim 6, wherein the MASH digital delta-sigma modulator comprises a MASH 1-1-1 architecture.

8. The fractional-N frequency synthesizer of claim 5, wherein each of the L stages comprises a first order error feedback modulator (EFM).

9. A fractional-N frequency synthesizer comprising a divider controller comprising a multistage noise shaping (MASH) digital delta-sigma modulator comprising L stages, wherein the Lth stage is configured to receive as an input the sum of the output of a preceding stage and a high amplitude dither signal,
wherein the MASH digital delta-sigma modulator comprises a MASH digital delta-sigma modulator with additive first-order dither,
wherein the MASH digital delta-sigma modulator comprises a MASH 1-1-1 architecture,
wherein the MASH 1-1-1 architecture with additive first-order dither comprises a first stage, a second stage and a third stage, and
wherein the third stage of the MASH architecture is configured to receive as an input the sum of the output of the preceding stage and the high amplitude dither signal.

10. The fractional-N frequency synthesizer of claim 9, wherein the high amplitude dither signal is filtered in accordance with the equation:

$$Y(z)=(1/M)*[X(z)+(1-z^{-1})D_1(z)+(1-z^{-1})^2 D_2(z)]+(1-z^{-1})^3 E_{q3}(z),$$

where Y corresponds to the z transform of an output signal of the MASH 1-1-1 architecture; X corresponds to the z transform of an input signal to the MASH 1-1-1 architecture; $D_1$ corresponds to the z transform of an additive first order dither signal; $D_2$ corresponds to the z transform of the high amplitude dither signal; and $E_{q3}$ corresponds to the z transform of a quantization error of the third stage of the MASH 1-1-1 architecture.

11. The fractional-N frequency synthesizer of claim 9, wherein the second stage of the MASH architecture is configured to receive as an input a binary dither signal.

12. The fractional-N frequency synthesizer of claim 9, wherein each of the L stages comprises a first order error feedback modulator (EFM).

* * * * *